(12) United States Patent
Inagaki

(10) Patent No.: US 6,970,044 B2
(45) Date of Patent: Nov. 29, 2005

(54) AUDIO SIGNAL AMPLIFIER CIRCUIT AND ELECTRONIC APPARATUS HAVING THE SAME

(75) Inventor: Ryosuke Inagaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/829,206

(22) Filed: Apr. 22, 2004

(65) Prior Publication Data

US 2004/0212423 A1   Oct. 28, 2004

(30) Foreign Application Priority Data

Apr. 23, 2003   (JP) ............................. 2003-117877

(51) Int. Cl.[7] ................................. H03F 3/45

(52) U.S. Cl. ................. 330/255; 330/264; 330/265

(58) Field of Search .................. 330/252, 253, 330/263–265, 269–271, 69, 98–100, 255

(56) References Cited

U.S. PATENT DOCUMENTS

| 4,995,113 A | * | 2/1991 | Robineau et al. ............ 381/117 |
| 5,095,282 A | * | 3/1992 | Dayton ........................ 330/69 |
| 6,268,770 B1 | * | 7/2001 | Barbetta ..................... 330/264 |

FOREIGN PATENT DOCUMENTS

| JP | 5-308228 | 11/1993 |
| JP | 9-46146 | 2/1997 |
| JP | 11-103216 | 4/1999 |

* cited by examiner

Primary Examiner—John B Nguyen
(74) Attorney, Agent, or Firm—Mattingly, Stanger, Malur & Brundidge, P.C.

(57) ABSTRACT

The present invention is provided with a first, a second and a third differential amplifier which operate at a source voltage with respect to a reference voltage or a voltage between these; an output stage having a first and a second transistor driven complimentarily; a first resistor connected to an input terminal; a second resistor connected to an output of the first differential amplifier circuit; and a first and a second feed back resistor connected to an output terminal of the output stage circuit.

15 Claims, 4 Drawing Sheets

AUDIO SIGNAL AMPLIFIER CIRCUIT AND ELECTRONIC APPARATUS HAVING THE SAME

BACKGROUND OF THE INVENTION

1. Field of the Invention

The present invention relates to an audio signal amplifier circuit and electronic apparatus having the same and more specifically an audio signal amplifier circuit which is used in an audio system for a portable type electronic apparatus such as a cellular phone, an immobile phone and a portable terminal device and an electronic apparatus such as a personal computer and which permits to reduce signal distortion even when driven under a comparatively low voltage and is suitable for forming in an integrated circuit having a broad dynamic range.

2. Conventional Art

Conventionally, many audio systems for a portable type electronic apparatus such as a cellular phone, an immobile phone and a portable terminal device and an electronic apparatus such as a personal computer are operated under a relatively low voltage such as about DC 6V of source voltage or less than such voltage, which caused a problem of narrowing the dynamic range thereof.

As a low voltage drive amplifier circuit which performs a push-pull operation suitable for a portable type electronic apparatus such as a cellular phone and a portable terminal device, a circuit wich uses a current mirror circuit at a drive stage and enlarges the dynamic range is known from JP-A-5-308228 or JP-A-9-46146.

In an acoustic use audio system, a power amplifier is used of which distortion rate is suppressed low and dynamic range is broadened through the use of FET transistors in a MOS circuit at the final stage, which is known from JP-A-11-103216. Further, as an operational amplifier of the same kind, a Bi-CMOS circuit in which an output stage in a C-MOSFET at the final stage is driven by a bipolar transistor is well known.

In an audio system for a portable type electronic apparatus such as a cellular phone, an immobile phone and a portable terminal device and an electronic apparatus such as a personal computer, an improvement of the sound quality and an increase of the output thereof are expected, and further such demand is keen. Moreover, a reduction of power consumption is also demanded.

When a bipolar transistor is used at a final stage, if an idling current is not suppressed, there arises a problem of increasing a power loss during no signals. A technology disclosed in JP-A-9-46146 as mentioned previously resolves the above problem. However, the technology has a drawback that the circuit structure of the drive stage somewhat complexes.

Therefore, it is conceived to suppress the idling current through a use of FET transistors in a C-MOS circuit at the final stage, however, when a CMOS operational amplifier in a push-pull operation is used in which a MOSFET is driven by a bipolar transistor under a comparatively low voltage drive less than DC 6V, problems remain unsolved that the drive of the MOSFET can not be performed sufficiently and the dynamic range thereof reduces.

Further, a CMOS operational amplifier in a push-pull operation is used, respective biases at the positive phase side and the opposite phase side have to be set differently. After thus set, the final stage has to be driven, therefore, number of poles (bend points) on Bode diagram (graph of frequency vs. total gain) increases, if driven under a low voltage, cross over distortion increases, and if the output is increases an oscillation likely occurs.

SUMMARY OF THE INVENTION

An object of the present invention is to resolve such problems in the conventional art and to provide an audio signal amplifier circuit, which permits to reduce signal distortion even when driven under a comparatively low voltage and is suitable for forming in an integrated circuit having a broad dynamic range, or to provide an electronic apparatus having the same.

For achieving the above object, an audio signal amplifier circuit or an electronic apparatus having the same is constituted to provide a first, a second and a third differential amplifier which operate at a source voltage with respect to a reference voltage or a voltage between the source voltage; an output stage having a first and a second transistor driven complimentarily; a first resistor connected to an input terminal; a second resistor connected to an output of the first differential amplifier circuit; and a first and a second feed back resistor connected to an output terminal of the output stage circuit, wherein the first differential amplifier circuit receives an input signal via the first resistor and inputs an output signal to the second and third differential amplifier circuit via the second resistor, the second differential amplifier circuit drives one of the first and the second transistor, the third differential amplifier circuit drives the other of the first and the second transistor, and an output signal of the output stage circuit is fed back to an input of the first differential amplifier circuit via the first feed back resistor and to inputs of the second and the third differential amplifier circuit via the second feed back resistor.

As will be apparent from the above, in the present invention the three differential amplifiers, the first, the second and the third differential amplifier circuit constitutes a drive circuit for final output stage transistors of a complimentary type drive.

Further, the respective differential amplifier circuits are operated at a source voltage with respect to a reference potential (ground) or at a voltage between the voltages. Thereby, a drive signal for the output stage circuit can be produced with a comparatively low voltage. Further, a double feed back circuit in which the output signal of the output stage circuit is fed back to the first differential amplifier circuit as well as to the inputs of the second and the third differential amplifier circuit is constituted.

In this instance, in particular, when the first, the second and the third differential amplifier circuit are structured substantially identical, since the number of poles on Bode diagram can be decreased and the output signal of the output stage circuit is fed back in double to the input side via the first feed back resistor and the second feed back resistor, such as the cross over distortion is reduced and the circuit oscillation is suppressed, even if the output is somewhat increased. Further, when C-MOSFET transistors are used for the first and the second transistor in the output stage circuit, the idling current can be reduced.

As a result, an audio signal amplifier circuit, which permits to reduce signal distortion even when driven under a comparatively low voltage and is suitable for forming in an integrated circuit having a broad dynamic range, and an electronic apparatus having the same can be realized.

DETAILED DESCRIPTION OF THE EMBODIMENT

Figure 1:
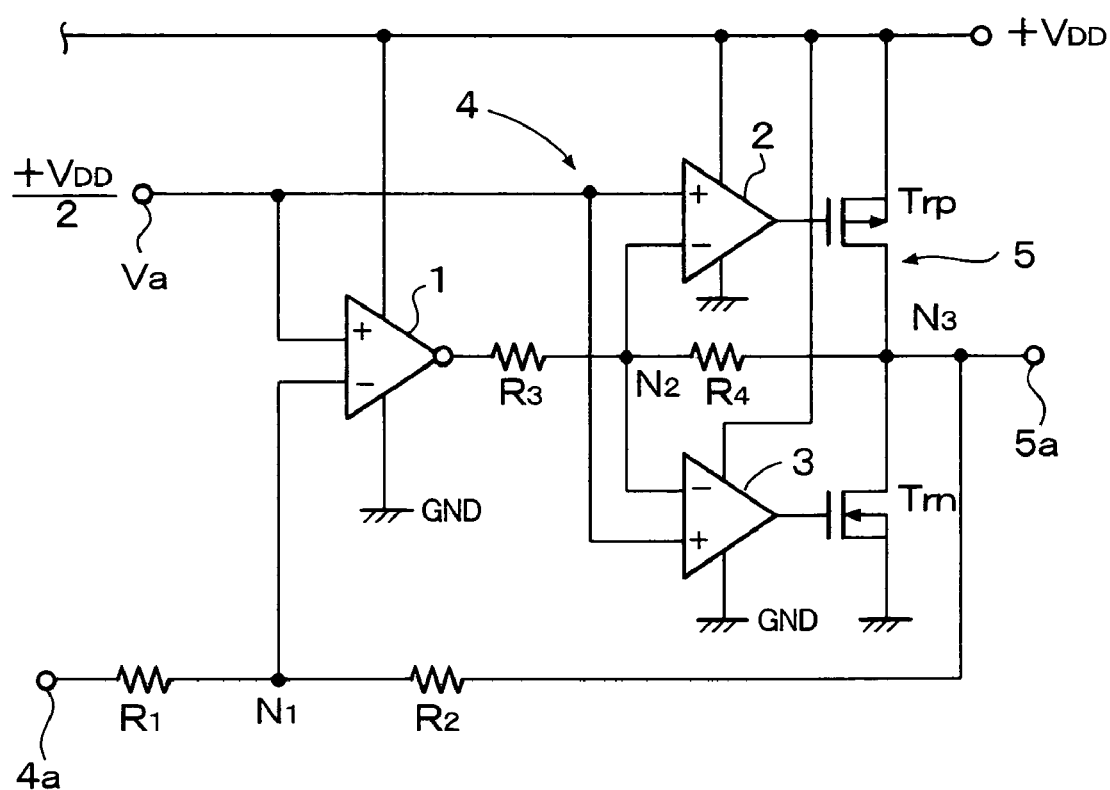
FIG. 1 is a block diagram primarily an audio output circuit in an embodiment to which an audio signal amplifier circuit of the present invention is applied.

In FIG. 1, 10 is an audio output circuit. The audio output circuit 10 is constituted by a drive stage circuit 4 including differential amplifier circuits 1, 2 and 3, an output stage circuit 5 of a C-MOSFET driven by the drive stage and resistors R1, R2, R3 and R4. Further, 5a is an output terminal of the output stage circuit 5 and 4a is an input terminal of the drive stage circuit 4.

The differential amplifier circuits 1, 2 and 3 are constituted respectively in a same circuit structure, respectively receive a power supply from a power source line +VDD (the source voltage thereof is assumed as +VDD) and operate at a voltage between the source voltage +VDD and the ground GND. The differential amplifier 1 is an amplifier circuit of non-inverting operation using the (-)input side (inverted input side) as an input terminal, the (-)input side is connected to a connection point N1 of a series circuit of the resistor R1 and the resistor R2 and the (+)input side (non-inverted input side) is connected to a predetermined bias line Va (=+VDD/2). The series circuit of the resistor R1 and the resistor R2 is a resistor for determining an amplification rate of the audio output circuit 10 and the resistor R1 is a reference resistor for the circuit, of which remaining one terminal is connected to the input terminal 4a. The remaining one terminal of the resistor R2 is connected to the side of the output terminal 5a and serves as a feed back resistor, which feeds back the output signal to the input side.

Further, at the input side of the differential amplifier circuit 1 an inverting symbol is added, which implies to take out with respect to an inverted and amplified output of the (-)input side a further inverted output thereof. As a result, an amplifier of non-inverting operation with respect to the input signal is formed as explained above. With a differential amplifier circuit, usually, with respect to both (+)input side and (-)input side outputs of in-phase and opposite phase (180?phase) can be easily taken out. Therefore, even if substantially the identical circuit structure is used for the differential amplifier circuits, an output of in-phase or opposite phase with respect to (+)input side as well as to (-)input side can be obtained only by changing output taking out positions of the differential amplifier circuits. Accordingly, existence and absence of the inverting symbol at the differential amplifier circuit 1 shows no significant difference in view of the structure of the differential amplifier circuit.

The differential amplifier 2 is an amplifier circuit of inverting operation using the (-)input side as an input terminal, the (-)input side is connected to a connection point N2 of a series circuit of the resistor R3 and the resistor R4 and the (+)input side is connected to the bias line Va. The series circuit of the resistor R3 and the resistor R4 is a resistor for determining an amplification rate of the differential amplifier circuit and the resistor R3 is a reference resistor for the circuit, of which remaining one terminal is connected to the output of the differential amplifier circuit 1. The remaining one terminal of the resistor R4 is connected to the side of the output terminal 5a and serves as a feed back resistor, which feeds back the output signal to the input side.

The differential amplifier 3 is an amplifier circuit of inverting operation using the (-)input side as an input terminal, the (-)input side is connected to a connection point N2 of a series circuit of the resistor R3 and the resistor R4 and the (+)input side is connected to the bias line Va, and constitutes a similar circuit as that of the differential amplifier circuit 2.

The outputs of the differential amplifier circuits 2 and 3 are respectively output to the output stage circuit 5 of C-MOSFETs. The output stage circuit 5 is constituted by a P channel MOSFET transistor Trp and an N channel MOSFET transistor Trn. The drain of the transistor Trp is connected to the drain of the transistor Trn and the connection point N3 thereof is connected to the output terminal 5a. The source of the transistor Trp is connected to the power source line +VDD and the source of the transistor Trn is connected to the ground GND.

In the present embodiment, the amplitude reference level for the input signal and the output signal of the differential amplifier circuits 1, 2 and 3 is set substantially at +VDD/2 by means of the voltage of the bias line Va. Further, the amplitude reference level for the output signal of the output stage circuit 5 is also set substantially at +VDD/2 because of the existence of the feed back resistor R4.

Accordingly, the transistor Trp is driven by a voltage signal exceeding +VDD/2 among input signals of the differential amplifier circuit 2 and is turned off, when the voltage signal is less than +VDD/2. On the other hand, the transistor Trn is driven by a voltage signal less than +VDD/2 among input signals of the differential amplifier circuit 3 and is turned off, when the voltage signal exceeds +VDD/2. Thereby, the output terminal 5a of the audio output circuit 10 generates a push-pull output.

Namely, in the audio output circuit 10 three units of the same differential amplifier circuit are provided which operates at a voltage between the source voltage +VDD and the ground GND and generates an output signal using the voltage +VDD/2 with respect to the source voltage as the amplitude reference. The bias voltage at the input and reference side of these differential amplifier circuits is also at +VDD/2. Further, by making use of one of the differential amplifier circuits as the input stage of first stage or the first stage drive circuit, the other two circuits are driven and the other two differential amplifier circuits are respectively assigned to the drive circuits for the output stage transistors in the output stage circuit 5 of the C-MOSFETs.

Thereby, the respective differential amplifier circuits 1 through 3 can generate drive signals for the output stage circuit 5 of a voltage between the source voltage +VDD and the ground GND, and in addition, since the output stage can be driven by the differential amplifier circuits having the same circuit structure, the dynamic range thereof can be broadened. Further, since the final output stage is constituted by the C-MOSFETs, an idling current is suppressed and noises are reduced to thereby improve the sound quality.

Figure 2:
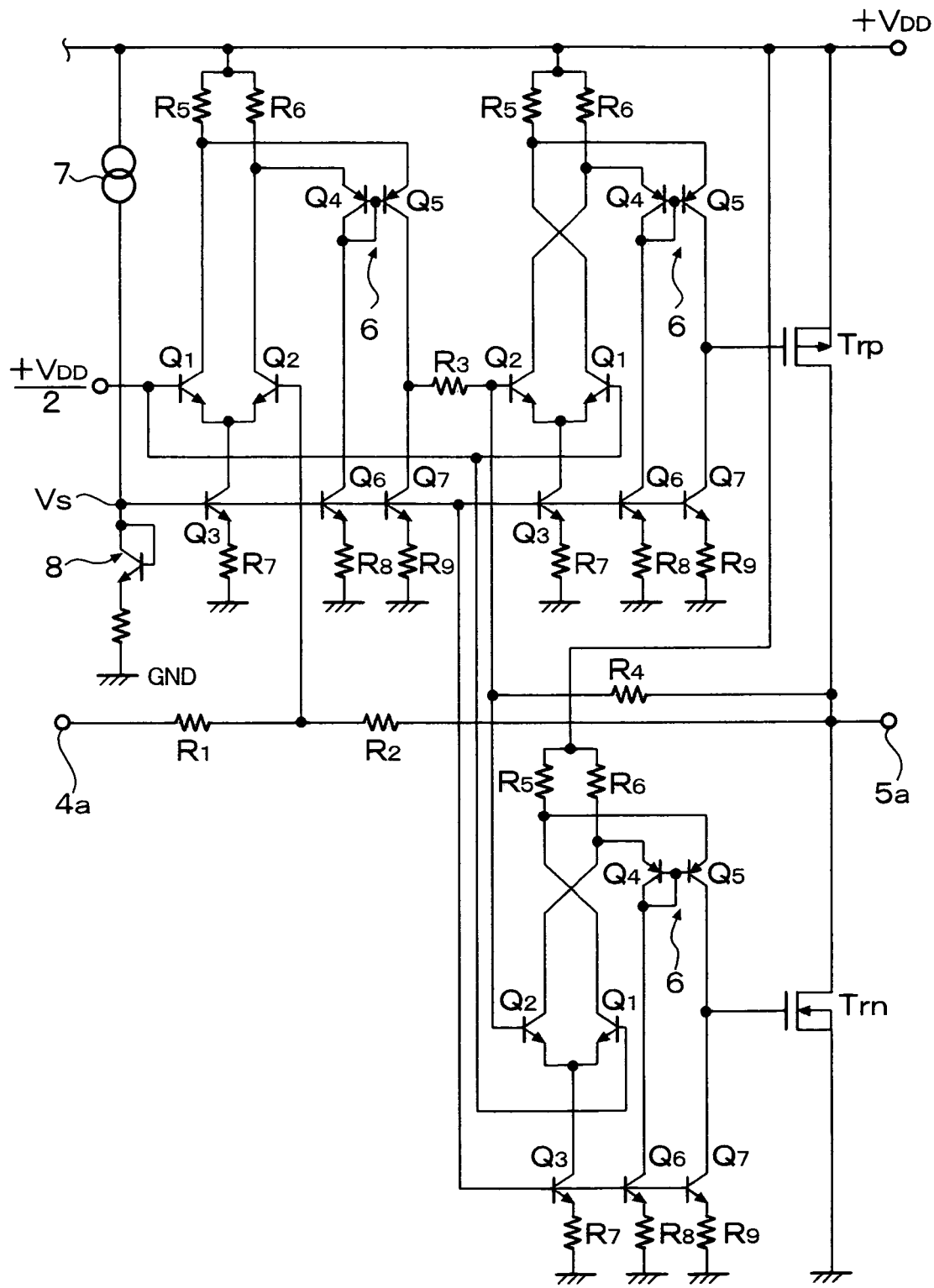
FIG. 2 is a circuit diagram for explaining an example of the specific circuits thereof.

FIG. 2 is one specific circuit of the above. The differential amplifier circuits in FIG. 2 are constituted in the same circuit structure as the differential amplifier circuit 1 by taking out the outputs in the same manner as in the differential amplifier circuit 1. Therefore, different from the instance in FIG. 1, in FIG. 2 all of the differential amplifier circuits are amplifiers of non-inverting operation. Thereby, the entirety of the audio output circuit 10 is operated as an inverting amplifier.

In the present embodiment, the transistor Trp is driven by a voltage signal less than +VDD/2 among input signals of the differential amplifier circuit 2 and is turned off, when the voltage signal exceeds +VDD/2. On the other hand, the transistor Trn is driven by a voltage signal exceeding +VDD/2 among input signals of the differential amplifier circuit 3 and is turned off, when the voltage signal becomes less than +VDD/2. Thereby, the output terminal 5a of the audio output circuit 10 generates a push-pull output.

Incidentally, the differential amplifier circuits 2 and 3 generate any of in-phase signal and opposite phase signal as an output signal using +VDD/2 as the amplitude reference regardless that the circuits are an inverting operation amplifier or non-inverting operation amplifier, the circuits are operable in both cases. Depending on whether the entirety of the audio output circuit 10 is operated as an inverting amplifier as in FIG. 2 or is operated as a non-inverting amplifier as in FIG. 1, the inverting and non-inverting operation of the differential amplifier circuits 2 and 3 can be selected, which is true with regard to the differential amplifier circuit 1.

Each of the input stages in the differential amplifier circuits 1, 2 and 3 is constituted by NPN differential transistors Q1 and Q2 having a constant current source of an NPN transistor at the downstream. The output stage thereof is constituted by a current mirror circuit 6 composed of PNP transistors Q4 and Q5. The transistor Q4 is an input side transistor in the diode connected current mirror circuit 6 and the transistor Q5 is an output side transistor in the current mirror circuit 6. Load resistors R5 and R6 are provided at the upstream side of the differential transistors Q1 and Q2 and the respective collectors thereof are connected via these load resistors R5 and R6 to the source line +VDD. The common emitters of the differential transistors Q1 and Q2 are connected via the collector-emitter of the transistor Q3 and a resistor R7 to the ground GND.

The emitters of the transistors Q4 and Q5 are connected respectively to connection points between the load resistors R5 and R6 and the differential transistors Q1 and Q2 and receive outputs from the differential transistors Q1 and Q2. The collectors of the transistors Q4 and Q5 are connected via the collector-emitters of NPN transistors Q6 and Q7 of constant current sources and resistors R8 and R9 to the ground GND, respectively.

Further, the bases of the transistors Q3, Q6 and Q7, which constitute the constant current sources are respectively connected to the bias line Vs of a constant voltage.

The current mirror circuit 6 is a circuit of which upstream side is connected to the load resistors R5 and R6 for the differential transistors Q1 and Q2 and at which downstream side a constant current source for setting the operation current thereof is provided. For this reason, the current mirror circuit 6 is a circuit, which does not perform a current mirror operation for the input signal, but converts the output voltage to a current and outputs an in-phase current. The input side of the transistor Q5 serving the output side of the current mirror circuit receives a voltage output signal being in-phase with an input signal at the (−)input side via the terminal of the load resistor R5. Accordingly, in this instance the current mirror circuit 6 constitutes a circuit corresponding to the inverting symbol provided at the output side of the differential amplifier circuit 1. In the present embodiment, the differential amplifier circuit including the differential transistors Q1 and Q2 and the current mirror circuit 6 corresponds to the differential amplifier circuit 1 in FIG. 1.

The bias line Vs is a line of a constant voltage taken out from a connection point between a constant voltage circuit 8 and a current source 7. Between the power source line +VDD and the ground GND the current source 7 and the constant voltage circuit 8, which receives a current from the current source 7 at the downstream thereof are disposed being connected in series. The constant voltage circuit 8 is constituted by a series circuit of a diode connected transistor and a resistor.

As will be seen from the above, since the differential amplifier circuits 1 through 3 are constituted in substantially the same circuit structure, their amplification characteristics with respect to frequency are almost the same, further, since their final stages are constituted respectively by a C-MOS-FET, the number of poles on Bode diagram is decreased.

As a result, such as a cross over distortion is improved even under a low voltage drive and a circuit oscillation is suppressed.

Figure 3:
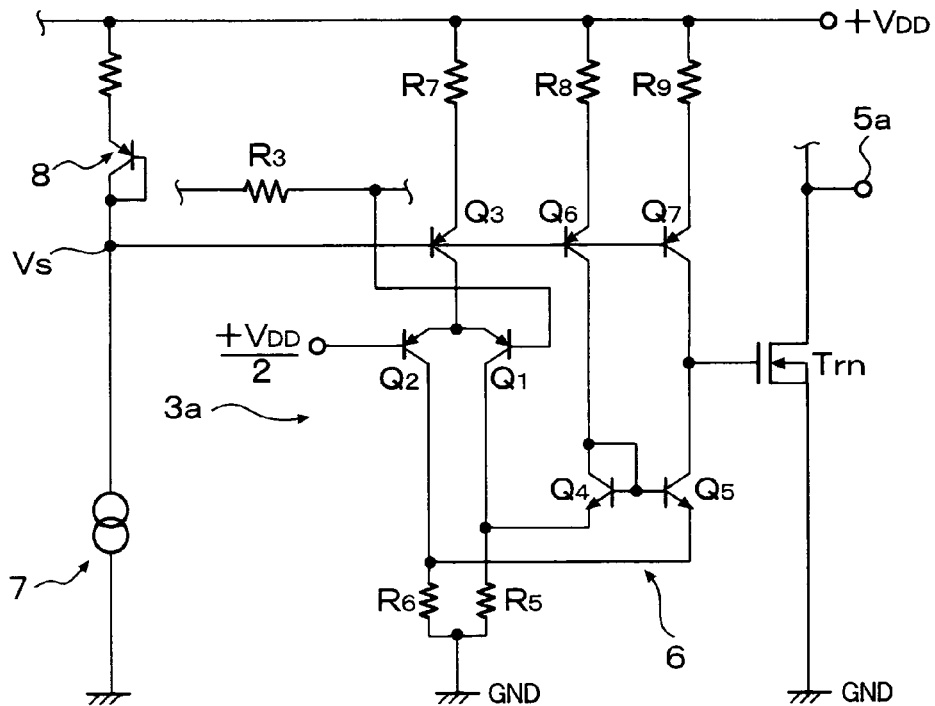
FIG. 3 is a circuit diagram for explaining another specific example of differential amplifier circuits in FIG. 1.

FIG. 3 is another specific example of the differential amplifier circuit in FIG. 1. A differential amplifier circuit 3a in FIG. 3 is a differential amplifier circuit in which the NPN transistors Q1 through Q3, Q6 and Q7 in the differential amplifier circuit 3 in FIG. 2 are replaced by PNP transistors Q1 through Q3, Q6 and Q7 and the PNP transistors Q4 and Q5 are replaced by NPN transistors Q4 and Q5. Such modified circuit can be used in replace of the differential amplifier circuit 3 in FIG. 2. Further, all of the other differential amplifier circuits 1 and 2 also can be replaced with the above circuit.

Although the bias line Vs is taken out from a connection point between the current source 7 and the constant voltage circuit 8, the position of these circuits are inverted from that in FIG. 2. Namely, the constant voltage circuit 8, which is constituted by a series circuit of a resistor and a diode connected transistor, is connected to the power source line +VDD and the current source receives a current from the constant voltage source 8 at the downstream thereof and sinks the same to the ground GND.

Figure 4:
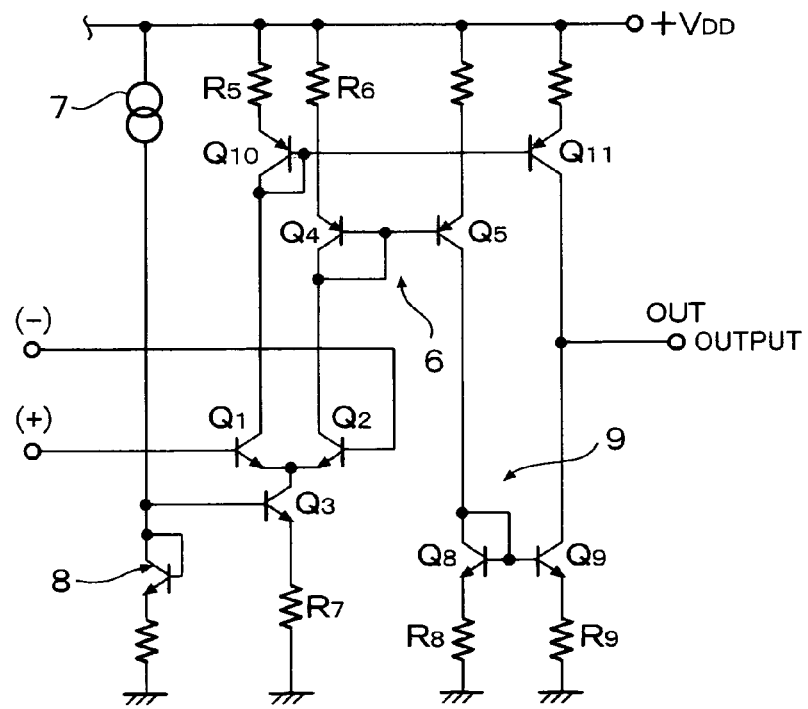
FIG. 4 is a circuit diagram for explaining still another specific example of differential amplifier circuits in FIG. 1.

FIG. 4 is still another specific example of the differential amplifier circuits in FIG. 1, which can be replaced by the differential amplifier circuit in FIG. 4.

The differential amplifier circuit in FIG. 4 receives an output of the current mirror circuit 6 in the differential amplifier circuit in FIG. 2 by a current mirror circuit 9 provided downstream thereof and produces an inverted current thereof. Then, an output is generated by a current mirror connected transistor Q11 provided at the upstream of the current mirror circuit 9.

The current mirror circuit 9 is constituted by NPN transistors Q8 and Q9 and at the upstream thereof is provided with the transistor Q11. The transistor functions as an output side transistor of the current mirror and at the side of the differential transistors Q1 and Q2 an input side transistor is provided. The input side transistor is a transistor Q10 inserted between the collector of the transistor Q1 and the resistor R5. Thereby, via the output side transistor Q10 the output from the differential transistor Q1 is output through the transistors Q10 and Q11 to the output terminal OUT.

Figure 5:
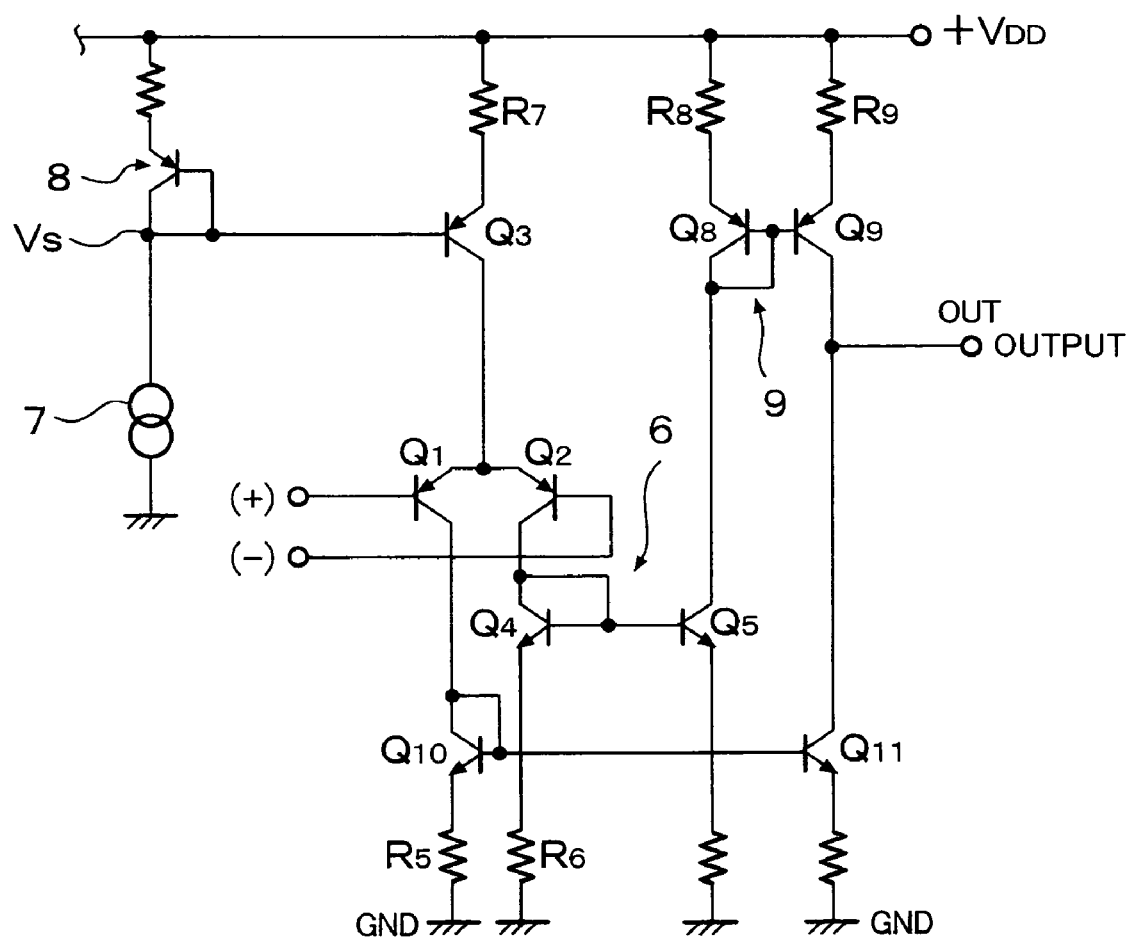
FIG. 5 is a circuit diagram for explaining a further specific example of differential amplifier circuits in FIG. 1.

FIG. 5 shows a differential amplifier circuit, in which the NPN transistors Q1 through Q3, Q8 and Q9 in the differential amplifier circuit in FIG. 4 are replaced by PNP transistors Q1 through Q3, Q8 and Q9 and the PNP transistors Q4, Q5, Q10 and Q11 in FIG. 4 are replaced by NPN transistors Q4, Q5, Q10 and Q11. In the like manner as in FIG. 3, the above differential amplifier circuit can be replaced with the differential amplifier circuit 3 in FIG. 2 or the differential amplifier circuits 1 and 2. The bias line therein is the same as in the instance in FIG. 3.

As has been explained above, in the present embodiments, the Bi-CMOS circuit in which the output stage of C-MOS-FET is driven by the bipolar transistors was exemplified, however, in the present invention if the output stage is an output circuit composed of complimentary drive type transistors, the transistors are not necessarily limited to the MOSFET transistors. However, in such modified instance the idling current may somewhat increase.

Further, in the present embodiments the drive stages of the three differential amplifier circuits are constituted by bipolar transistors, however, the same can be, of course, constituted by differential amplifier circuits of MOSFET transistors.

Still further, in the present embodiments a positive voltage of the power source voltage is used, however, a negative power source voltage can be also applied in the present invention.

What is claimed is:

1. An audio signal amplifier circuit comprising:
   a first, a second and a third differential amplifier which operate at a source voltage with respect to a reference potential or a voltage between the source voltage;
   an output stage having a first and a second transistor driven complimentarily; a first resistor connected to an input terminal;
   a second resistor connected to an output of the first differential amplifier circuit; and
   a first and a second feed back resistor connected to an output terminal of the output stage circuit,
   wherein the first differential amplifier circuit receives an input signal via the first resistor and inputs an output signal to the second and third differential amplifier circuit via the second resistor, the second differential amplifier circuit drives one of the first and the second transistor, the third differential amplifier circuit drives the other of the first and the second transistor, and an output signal of the output stage circuit is fed back to an input of the first differential amplifier circuit via the first feed back resistor and to inputs of the second and the third differential amplifier circuit via the second feed back resistor.

2. The audio signal amplifier circuit according to claim 1, wherein at least one of the first, the second and the third differential amplifier circuit is an amplifier circuit of non-inverting operation and the reference potential is the ground.

3. The audio signal amplifier circuit according to claim 2, wherein the level of the amplitude reference voltage of input and output signal of the first, the second and the third differential amplifier circuit and the level of the amplitude reference voltage of the output signal of the output stage circuit are substantially ½ with respect to the power source voltage.

4. The audio signal amplifier circuit according to claim 3, wherein the second differential amplifier circuit, when the intput thereof is a voltage signal of exceeding the ½ voltage, drives the first transistor, and when the input thereof is a voltage signal less than the ½ voltage, turns off the first transistor, and the third differential amplifier circuit, when the input signal thereof is a voltage signal of less than the ½ voltage, drives the second transistor, and when the input thereof is a voltage signal exceeding the ½ voltage, turns off the second transistor.

5. The audio signal amplifier circuit according to claim 4, wherein each of the first, the second and the third differential amplifier circuit is an amplifier circuit of non-inverting operation and the first and the second transistor in the output stage circuit are C-MOSFET transistors.

6. The audio signal amplifier circuit according to claim 5, wherein the first transistor is a P channel MOSFET transistor, the second transistor is a N channel MOSFET transistor, the second differential amplifier circuit, when the intput thereof is a voltage signal of less than the ½ voltage, drives the first transistor, and when the input thereof is a voltage signal exceeding the ½ voltage, turns off the first transistor, and the third differential amplifier circuit, when the input signal thereof is a voltage signal of exceeding the ½ voltage, drives the second transistor, and when the input thereof is a voltage signal less than the ½ voltage, turns off the second transistor.

7. The audio signal amplifier circuit according to claim 6, wherein the first, the second and the third differential amplifier circuit are substantially identical circuits.

8. The audio signal amplifier circuit according to claim 7, wherein at least one of the first, the second and the third differential amplifier circuit is a circuit in which the PNP transistors therein are replaced by NPN transistors and the NPN transistors therein are replace-d by PNP transistors.

9. The audio signal amplifier circuit according to claim 7, wherein the ½ voltage with respect to the power source voltage is input to the (+) input sides of the first, the second and the third differential amplifier circuit and an input signal is received at the (−) input side thereof.

10. The audio signal amplifier circuit according to claim 7, wherein each of the first, the second and the third differential amplifier circuit respectively includes a pair of differential transistors, a first and a second load resistors connected respectively to the differential transistors, a current mirror circuit which takes out a voltage signal obtained from the load resistors as a current signal and a first and a second constant current source which respectively set an operation current for an input side transistor and output side transistor in the current mirror circuit.

11. An electronic apparatus having an audio signal amplifier circuit comprising:
    a first, a second and a third differential amplifier which operate at a source voltage with respect to a reference potential or a voltage between the source voltage;
    an output stage having a first and a second transistor driven complimentarily;
    a first resistor connected to an input terminal; a second resistor connected to an output of the first differential amplifier circuit; and
    a first and a second feed back resistor connected to an output terminal of the output stage circuit,
    wherein the first differential amplifier circuit receives an input signal via the first resistor and inputs an output signal to the second and third differential amplifier circuit via the second resistor, the second differential amplifier circuit drives one of the first and the second transistor, the third differential amplifier circuit drives the other of the first and the second transistor, and an output signal of the output stage circuit is fed back to an input of the first differential amplifier circuit via the first feed back resistor and to inputs of the second and the third differential amplifier circuit via the second feed back resistor.

12. The electronic apparatus according to claim 11, wherein at least one of the first, the second and the third differential amplifier circuit is an amplifier circuit of non-inverting operation, the first and the second transistor in the output stage circuit are C-MOSFET transistors and the reference potential is the ground.

13. The electronic apparatus according to claim 12, wherein the electronic apparatus is a telephone.

14. The electronic apparatus according to claim 13, wherein the telephone is a portable type phone.

15. The electronic apparatus according to claim 12, wherein the electronic apparatus is a portable type electronic apparatus.

* * * * *